United States Patent [19]
Yoshii et al.

[11] Patent Number: 5,488,234
[45] Date of Patent: Jan. 30, 1996

[54] SEMICONDUCTOR ELEMENT HAVING BIVALENT AND VI GROUP ELEMENT AND AN INSULATING LAYER

[75] Inventors: Shigeo Yoshii, Nagaokakyo; Kazuhiro Okawa, Moriguchi; Ayumi Tsujimura, Takatsuki; Tsuneo Mitsuyu, Hirakata, all of Japan

[73] Assignee: Matsushita Electric Industrial Co., Ltd., Kadoma, Japan

[21] Appl. No.: 214,281

[22] Filed: Mar. 17, 1994

[30] Foreign Application Priority Data

Mar. 18, 1993 [JP] Japan .................. 5-058241
Mar. 25, 1993 [JP] Japan .................. 5-066569

[51] Int. Cl.$^6$ .......... H01L 33/00; H01L 29/22; H01L 31/0256; H01L 31/0296
[52] U.S. Cl. .................. 257/94; 257/93; 257/99; 257/78
[58] Field of Search .................. 257/99, 94, 93, 257/92, 91, 13, 78; 372/45

[56] References Cited

U.S. PATENT DOCUMENTS

| 4,783,426 | 11/1988 | Nishizawa ............... 257/78 |
| 4,868,612 | 9/1989 | Oshima et al. .......... 257/13 |
| 4,992,837 | 2/1991 | Sakai et al. ............. 372/45 |
| 5,122,844 | 6/1992 | Akiba et al. ............ 372/45 |

FOREIGN PATENT DOCUMENTS

| 54-20684 | 2/1979 | Japan ................ 257/94 |
| 61-263288 | 11/1986 | Japan ................ 257/13 |

OTHER PUBLICATIONS

English language translation of Japanese Kokai Patent Application No. Sho 54 (1979) 20684 (Application date: Jul. 18, 1977, Publication date: Feb. 16, 1979.).

Haase et al., "Blue–green laser diodes", *Appl. Phys. Lett.* 59 (11), 9 Sep. 1991 (pp. 1272–1274).

Hayashi et al., "$Zn_{1-x}Cd_xSe$ (X=0.2–0.3) Single–Quantum–Well Laser Diodes without GaAs Buffer Layers", *Jpn. J. Appl. Phys.*, vol. 31 (1992) pp. L1478–L1480.

*Primary Examiner*—Stephen D. Meier
*Attorney, Agent, or Firm*—Fish & Richardson

[57] ABSTRACT

Ions are implanted to the n-type or p-type semiconductor layers of a semiconductor element, which includes a semiconductor having a multilayer structure on a substrate, a metal electrode on one entire surface of the semiconductor and a metal section partially formed on the metal electrode, in an amount from $10^{12}$ ions/cm$^2$ to $10^{18}$ ions/cm$^2$, thus forming an insulating layer in the n-type or p-type semiconductor layers.

10 Claims, 3 Drawing Sheets

5,488,234

SEMICONDUCTOR ELEMENT HAVING BIVALENT AND VI GROUP ELEMENT AND AN INSULATING LAYER

FIELD OF THE INVENTION

The invention relates to a semiconductor element, a semiconductor laser element, and methods of manufacturing the same. More particularly, the invention relates to an insulator for a semiconductor element.

BACKGROUND OF THE INVENTION

In order to prolong the life of a semiconductor laser element, it is necessary for an insulating layer to release efficiently to the outside heat generated by the semiconductor.

$SiO_2$, polyimide resins or the like have been conventionally used for insulating layers of semiconductor laser elements. (See Hiroyuki Matsunami, Semiconductor Technology, Shoukoudo, pp. 214, or Applied Physics Letters, vol. 59, pp. 1,272 (1991).) However, $SiO_2$ and polyimide resins have no sufficient thermal contacts with semiconductors, and their thermal conductivities are too weak to radiate heat efficiently. Therefore, conventional semiconductor laser elements having $SiO_2$ or polyimide resins as insulating layers have poor endurance.

It was also impossible to apply n-type semiconductors anywhere above the active layers of conventional semiconductor laser elements. In conventional semiconductor laser elements, the active layers and the insulating layers are apart from each other. If an n-type semiconductor with high carrier mobility is applied between the active layer and the insulating layer, current is diffused in a horizontal direction and cannot be confined to the active layer. Therefore, in conventional semiconductor laser elements, n-type semiconductors are applied anywhere below the active layers while p-type semiconductors with a low carrier mobility are applied anywhere above the active layers. However, because of high top electrode resistance and the Schottky barrier between the top electrodes and the p-type semiconductors, the operating voltage of conventional semiconductor laser elements tends to become high, and heat is generated at the top electrodes of the elements.

SUMMARY OF THE INVENTION

In order to solve the problems of conventional semiconductor laser elements, this invention provides a semiconductor element which has an insulating layer having good thermal contacts with semiconductor materials, high thermal conductivities and sufficient insulating properties. The invention also provides methods of manufacturing the semiconductor element of the invention.

In order to accomplish the above and other objects and advantages, the invention provides a semiconductor element comprising a compound of at least one bivalent element and at least one VI group element, and an insulating layer which is formed by implanting ions in an amount from $10^{12}$ to $10^{18}$ ions/cm$^2$ into n-type or p-type semiconductor layers.

It is preferable that the thickness of the insulating layer is from 10 nm to 10 µm.

It is preferable that a compound of (1) at least one bivalent element selected from the group consisting of Zn, Cd, Mg, Mn, Hg and Ca and (2) at least one VI group element selected from the group consisting of S, Se and Te is used for the semiconductor.

It is preferable that the semiconductor element is a semiconductor laser element.

It is preferable that the insulating layer is a current blocking layer.

It is preferable that the semiconductor laser element comprises a semiconductor having a multilayer structure on a substrate, a metal electrode on one entire surface of the semiconductor and a metal section formed partially on the metal electrode, and that the semiconductor excepting the area immediately below the metal section is insulated by the implantation of ions, thus forming the current blocking layer.

It is preferable that the metal section, formed partially on the metal electrode, comprises laminated metal layers which form stripes on the metal electrode.

It is preferable that the thickness of the metal electrode is from 10 nm to 1 µm.

It is preferable that the thickness of the metal section is from 0.1 µm to 10 µm.

It is preferable that the semiconductor is an n-type semiconductor, and that the implanted ions are I group or V group element ions.

It is preferable that the semiconductor is a p-type semiconductor, and that the implanted ions are III group or VII group element ions.

The semiconductor element of the invention comprising at least one bivalent element and at least one VI group element is manufactured by implanting ions in an amount from $10^{12}$ to $10^{18}$ ions/cm$^2$ in the n-type or p-type semiconductor layers at $10^{-5}$ to $10^{-9}$ Torr vacuum, thus forming an insulating layer in the n-type or p-type semiconductor layers.

It is preferable in this method that the incident angle of ions is 0°–10°.

It is preferable in this method that the substrate temperature during the implantation of ions is 0°–300° C.

It is preferable in this method that the ion beam current density during the implantation of ions is 10 nA/cm$^2$–1 µA/cm$^2$.

It is preferable in this method that the semiconductor element is a semiconductor laser element, and that ions are implanted via a metal section and a metal electrode of the semiconductor element.

It is preferable in this method that the metal section, formed partially on the metal electrode, comprises laminated metal layers which form stripes on the metal electrode.

It is preferable in this method that the thickness of the metal electrode is from 10 nm to 1 µm.

It is preferable in this method that the thickness of the metal section is 0.1–10 µm.

It is preferable in this method that the semiconductor is an n-type semiconductor, and that the implanted ions are I group or V group element ions.

It is preferable in this method that the semiconductor is a p-type semiconductor, and that the implanted ions are III group or VII group element ions.

It is preferable in this method that the acceleration voltage of ions is from 10 keV to 1000 keV.

It is preferable in this method that the implanted ions are nitrogen ions, that the acceleration voltage of ions is from 10 keV to 1000 keV, and that the semiconductor where the ions are implanted is an n-type semiconductor.

DETAILED DESCRIPTION OF THE INVENTION

Figure 1:
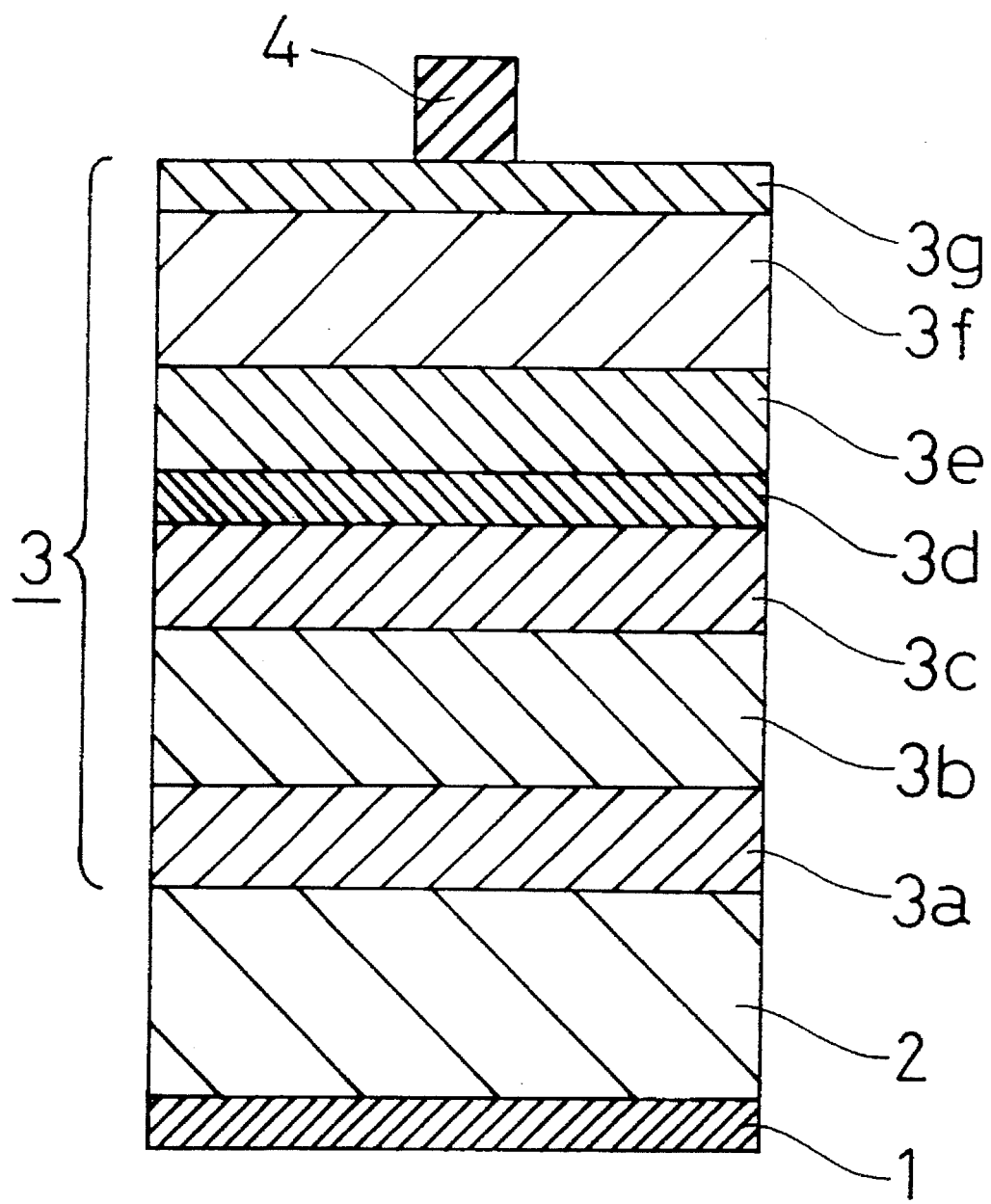
FIG. 1 shows a cross-sectional view of a semiconductor laser of one embodiment of the invention before the implantation of ions.

An insulating layer is formed in a II–VI group semiconductor by implanting ions to the n-type or p-type II–VI group semiconductor layers in an amount from $10^{12}$–$10^{18}$ ions/cm$^2$, thus manufacturing a II–VI group semiconductor element which comprises an insulating layer having good thermal contacts with semiconductor materials and sufficient thermal conductivities.

When the energy of incident ions is low, the reflection and/or accumulation of ions, the sputtering of surface atoms or the like is generated by the process of implanting ions to a II–VI group semiconductor. Sufficiently accelerated ions, on the other hand, penetrate the inside of the II–VI group semiconductor, and lose energy due to interactions with atomic nuclei of the semiconductor (nucleus collision) or with electrons (electron collision). As a result, ions stop penetrating at a certain depth of the semiconductor.

Atoms of the semiconductor are displaced from the lattice positions due to the nucleus collision between incident ions and the atoms. Displaced atoms then knock off other atoms, thereby generating lattice defects including interstitial atoms and vacant lattice points. Dislocations and/or voids are then generated.

Since carriers inside the semiconductor are reflected and scattered by these lattice defects, dislocations or the like, the mobility of carriers is lowered. As a result, since the electric conductivity at the area where ions are implanted decreases considerably, the area has high resistance and is employed as a useful insulating layer.

Heat generated in the semiconductor element is diffused by lattice vibrations. However, if the lattice constants of the insulating layer and n-type (or p-type) layer are not adjusted and/or if there is no continuous interface between the insulating layer and the n-type (or p-type) layer, lattice vibrations are scattered and reflected at the interface. Thus, a preferable level of thermal contacts between the insulating layer and the n- (or p-type) layer cannot be obtained.

According to the method of manufacturing an insulating layer of the invention, however, there is no clear interface between the insulating layer and the p-type (or n-type) layer. As a result, lattice vibrations are directly diffused from the n-type (or p-type) layer to the insulator, thus providing superior thermal contacts between the insulating layer and the p-type (or n-type) layer.

Since the thermal conductivity of the insulating layer of the invention is higher than that of SiO$_2$ or polyimide resins, the insulating layer releases heat received from the semiconductor to the outside of the semiconductor element at a higher speed.

The semiconductor laser element comprising the insulating layer of the invention has lower calorific power than a conventional semiconductor laser element comprising SiO$_2$ or polyimide resins as an insulating layer. The insulating layer of the invention also has higher radiation properties than the conventional SiO$_2$ or polyimide resin insulating layer. Therefore the semiconductor laser element of the invention has superior endurance.

In manufacturing the semiconductor laser element of the invention, most of the ions implanted from the surface of the metal electrode penetrate the electrode and the II–VI group semiconductor, thus making the penetrated area of the II–VI group semiconductor highly resistant.

However, ions irradiated to the surface of a metal section, which is set on the metal electrode, lose penetrating energy due to interactions with metal atoms of the metal section and stop penetrating inside of the metal section without reaching the metal electrode and the II–VI group semiconductor. Thus, the metal section is used as a mask against the implantation of ions, and the area right below the metal section has little resistance.

In other words, no electric current transmits through the area of the II–VI group semiconductor where ions are implanted (insulating layer or current blocking area) while the current is confined and flows only through the area right below the metal section.

In the semiconductor laser element of the invention, the insulating layer is sufficiently close to an active layer, thus efficiently confining the electric current. Thus, current density at the active layer is high, and the threshold current required for a laser oscillation is low. The operating voltage required for obtaining a certain level of laser output is also lowered by this semiconductor laser element.

When the semiconductor laser element is fixed on a heat sink (radiator), thermal contacts between the heating area of the element and the heat sink improve by applying the metal section having high thermal conductivity on the top of the heating area.

Therefore, the semiconductor laser element of the invention has good radiating properties and endurance.

Since the insulator of the invention is manufactured by implanting ions in an amount from $10^{12}$ to $10^{18}$ cm ions/$^2$ to an n-type or p-type semiconductor, it increases thermal contacts with semiconductor materials and improves thermal conductivity.

The insulating layer of the invention is useful for semiconductor laser elements, light emitting diode elements, IC, LSI and the like. The insulating layer is particularly useful since it diffuses heat generated inside the semiconductor to the outside.

For a semiconductor, it is preferable to use a compound of at least one bivalent element selected from the group consisting of Zn, Cd, Mg, Mn, Hg and Ca and at least one VI group element selected from the group consisting of S, Se and Te. Such a semiconductor (for example, $Zn_xCd_{1-x}S_ySe_{1-y}$, $Zn_xCd_{1-x}S_ySe_{1-y}$, $Zn_xMg_{1-x}S_ySe_{1-y}$ or $Zn_xMn_{1-x}S_ySe_{1-y}$ (wherein $0 \leq X \leq 1$ and $0 \leq Y \leq 1$)) can vary the lattice constants within the range of 0.53–0.67 nm. As a result, the lattice constant can be adjusted to the lattice constant of the n-type (or p-type) layer of the semiconductor laser element.

This semiconductor can arrange the band gap in a range of 0–4.2 eV, and its conduction type can also be easily controlled by adding p type and n type impurities to the semiconductor.

It is preferable to use ions of I group or V group elements such as hydrogen, nitrogen, lithium, phosphorus and the like as incident ions to an n-type semiconductor. Ions of I group or V group elements generate acceptor levels in the n-type semiconductor. The ions, at the same time, compensate electrons (carriers) inside the semiconductor and reduce the density of the electrons. As a result, it is possible to manufacture an insulating layer with high resistance by irradiating ions at a relatively low dose, and to improve the thermal conductivity of the insulating layer by reducing the damage to the crystals of the insulating layer.

For these reasons, it is preferable to use ions of III group or VII group elements generating donor levels such as chlorine, gallium, fluorine, bromine and the like as incident ions to a p-type semiconductor.

In addition, nitrogen and phosphorus ions can also be used as incident ions, since the implanted ions in the semiconductor layers do not diffuse to the area immediately below the metal section where the ions are not implanted.

When the substrate temperature during the implantation of ions is 0°–300° C., there is no damage to the semiconductor except the area where the ions are implanted. The insulating layer of the semiconductor, in addition, achieves a stable resistivity.

If the ion beam current density during the implantation of ions is 10 nA/cm$^2$–1 µA/cm$^2$, no damage is provided to the semiconductor except the area where the ions are implanted. Moreover, the insulating layer of the semiconductor can be formed efficiently.

The acceleration voltage of ions is preferably from 10 keV to 1000 keV. Ions accelerated at this range of voltage can easily penetrate the semiconductor. As a result, surface atoms are not sputtered, and there is no nucleus collision between the ions and the atoms of the semiconductor.

The thickness of the insulating layer is controlled by arranging the acceleration voltage of incident ions. For instance, when nitrogen ions are implanted to the ZnSe of the semiconductor, the insulating layer with a thickness of 10 nm–10 µm is manufactured by changing the accelerating voltage in the range of 10–1000 keV. However, it is difficult to determine the exact thickness of the insulating layer since there is no clear interface between the insulating layer and the semiconductor in the invention.

Gold having a good thermal conductivity and electric conductivity can be used for the metal section of the semiconductor element. In addition, since gold has a large atomic weight, it can efficiently stop the ions from penetrating.

If nitrogen ions accelerated to 10–1000 keV are used as implanted ions, and gold is used as the metal section, the ions can be efficiently stopped from penetrating the metal section by setting the thickness of the section at 0.1–10 µm.

In the invention, it is possible to form the insulating layer sufficiently close to the active layer as a current blocking layer. Since the active layer is also surrounded with the insulating layer, an n-type semiconductor can be applied above the active layer without scattering electric current. The insulating layer has preferable ohmic contacts particularly with n-type semiconductors, and metal electrodes with low contact resistance can be used as a top electrode. Thus, the operating voltage of the semiconductor element as well as the generation of heat at the top electrode can be reduced.

When a p-type semiconductor is applied above the active layer, the insulating layer of the invention can more efficiently confine electric current than conventional insulating layers. Therefore, current density in the active layer is improved, and the threshold current of the element is reduced.

The invention is now specifically explained by referring to the following examples. The examples are illustrative and should not be construed as limiting the invention in any way.

Light absorption from the defects in the semiconductor implanted with ions is small enough that the semiconductor does not require a heat treatment. Even if the heat treatment is carried out on the semiconductor after the implantation of ions, the crystallinity of the semiconductor can be recovered by a heat treatment of 100°–400° C. This is because the ionicity of the semiconductor is high, and the atoms are mobile. Therefore, the insulating layer can be easily formed in the semiconductor layers without damaging them with heat.

EXAMPLE 1

A 1.8 µm thick ZnSe thin film (single-crystal II–VI group semiconductor) was formed on a GaAs substrate by a molecular beam epitaxial growth (MBE) method at 200°–400° C. growth temperature and $1 \times 10^{-8}$ Torr vacuum. By adding chlorine at $2 \times 10^{18}$ cm$^{-3}$ during the film growth, the ZnSe thin film became n-type. The resistivity of the n-type ZnSe thin film was 0.08 Ω.cm.

Hydrogen ions accelerated with 350 keV acceleration voltage were implanted to the n-type ZnSe thin film. The incident angle of ions was 7°, and the dose was $1 \times 10^{15}$ ions/cm$^2$. The current density was 23 nA/cm$^2$ and the substrate temperature as 100° C. Due to the implantation of the ions, the resistivity of the n-type ZnSe thin film became higher than $1 \times 10^4$ Ω.cm. Based on this level of resistance, the n-type ZnSe thin film can be used as an insulating layer of a semiconductor element.

The principles of providing a practical level of resistance are as follows. Accelerated ions penetrate the inside of the II–VI group semiconductor, and lose energy due to the interactions with atomic nuclei of the semiconductor (nucleus collision) or with electrons (electron collision). As a result, ions stop penetrating at a certain depth of the semiconductor.

Atoms of the semiconductor are displaced from the lattice positions due to the nucleus collision between incident ions and the atoms. Displaced atoms then knock off other atoms, thereby generating lattice defects including interstitial atoms and vacant lattice points. Dislocation or void is then generated by shifting and combining the lattice defects. Since carriers inside the semiconductor are reflected and scattered by these lattice defects, dislocations or the like, the mobility of carriers is lowered. As a result, since the electric conductivity at the area where ions are implanted decreases considerably, the area has high resistance and becomes useful as a good insulating layer.

The thermal conductivity of the insulating layer of this example was 15 W/m·k while the thermal conductivities of a conventional SiO$_2$ insulating layer and of a polyimide resin insulating layer were 1.4 W/m·k and 0.3 W/m·k respectively.

EXAMPLE 2

A II–VI group semiconductor laser element as shown in FIG. 1 was manufactured as follows:

forming a ZnSe base SQW-SCH (single-quantum-well separate-confinement-heterostructure) 3 on the surface of a p-type GaAs substrate 2 by an MBE method;

forming a mask 4 on the surface of the ZnSe base SQW-SCH 3; and depositing a metal electrode 1 on the bottom surface of the p-type GaAs substrate 2.

Mask 4 is to prevent the penetration of irradiated ions, thus forming an area of low resistance inside the semiconductor right below the mask.

Figure 2:
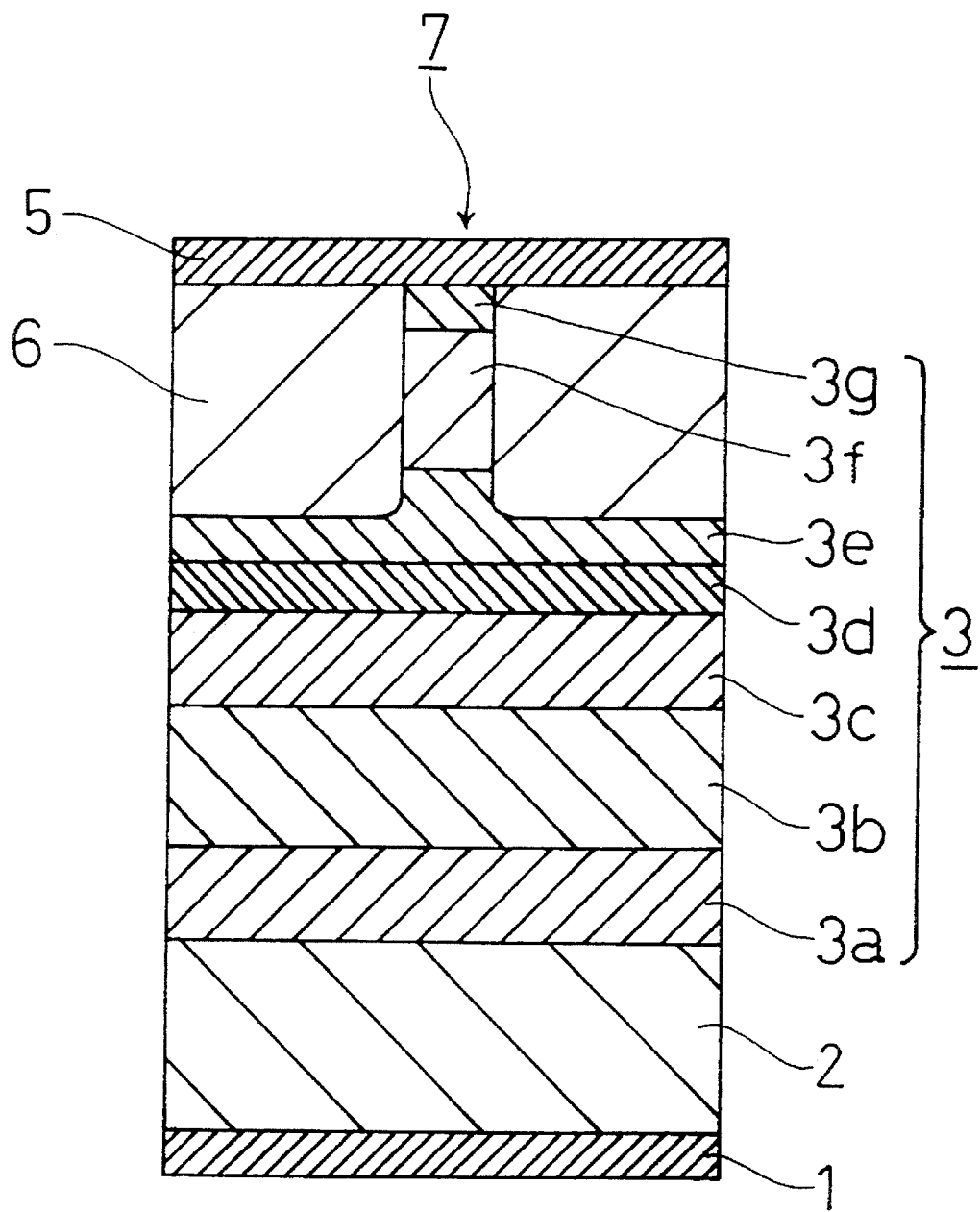
FIG. 2 shows a cross-sectional view of a semiconductor laser of the embodiment of the invention after the implantation of ions.

Nitrogen ions were irradiated to the top surface of the II–VI group semiconductor laser element shown in FIG. 1 with 350 keV acceleration voltage. The incident angle of ions was 7°, and the dose of the ions was $1\times10^{15}$ ions/cm$^2$. Except for the area in the semiconductor right below mask 4, nitrogen ions were implanted. As a result, as shown in FIG. 2, a current blocking layer (insulating layer) 6 was formed. Then, mask 4 was removed, and a metal electrode 5 was deposited on current blocking layer 6. Thus, a semiconductor laser element 7 shown in FIG. 2 was manufactured. In FIGS. 1–2, 3a and 3c indicate p-type ZnSe layers; 3b is a p-type ZnSSe layer; 3d is a ZnCdSe active layer; 3e and 3g indicate n-type ZnSe layers; and 3f is an n-type ZnSSe layer.

Semiconductor laser element 7 had 520 nm wavelength, and oscillated at 360 mA threshold current and 33 V element voltage.

As a comparison, a semiconductor laser element, which had the same laser structure, stripe shape and oscillating wavelength as semiconductor laser element 7 but had a conventional insulating layer such as SiO$_2$, polyimide or the like, oscillated at 930 mA threshold current and 39 V element voltage.

In other words, by applying current blocking layer 6 instead of a conventional insulating layer to an n-type II–VI group semiconductor, the threshold current can be reduced by 570 mA. Therefore, the element of the invention had three times more element efficiency at 1 mW output than the conventional element; it also reduced the caloric power to less than one third of the caloric power of the conventional element.

Heat generated inside the semiconductor element is diffused by lattice vibrations. However, if the lattice constants of the insulating layer and the n-type (p-type) layer are not matched or if there is no continuous interface between the insulating layer and the n-type (p-type) layer, lattice vibrations are scattered and/or reflected at the interface. Thus, preferable thermal contacts between the insulating layer and the n-type (p-type) layer cannot be obtained.

In the method of forming current blocking layer 6, implanted ions are randomly scattered and stopped inside the II–VI group semiconductor. The resistivity of the current blocking layer increases as the quantity of implanted ions increases. There is no clear interface between the current blocking layer and the p-type (or n-type) semiconductor. Therefore, the lattice vibrations can directly spread from the n-type (or p-type) layers to current blocking layer 6, thus providing preferable thermal contacts between the n-type (or p-type) layers and the current blocking layer. The thermal conductivity of current blocking layer 6 is higher than that of the conventional insulating layer such as SiO$_2$ or polyimide resins. Therefore, current blocking layer 6 can release the heat generated in the semiconductor element at high speed.

Semiconductor laser element 7 comprising current blocking layer 6 has less calorific power and better radiating properties than the laser element comprising the conventional insulating layer. Thus, the life span of semiconductor laser element 7 is 1.5–5 times longer than that of the conventional semiconductor laser element.

Current blocking layer 6 shown in FIG. 2 is formed down to the area above ZnCdSe active layer 3d. However, if the acceleration voltage of implanted ions is increased, current blocking layer 6 can be formed down to the area below ZnCdSe active layer 3d.

The semiconductor treated with heat at 300° C. for five minutes after the implantation of ions exhibited the same characteristics as the semiconductor with no heat treatment.

The structures of the semiconductor laser element of the invention include not only a single-quantum-well separate-confinement-heterostructure but a buried-heterostructure and a multiple quantum well structure.

EXAMPLE 3

Figure 3:
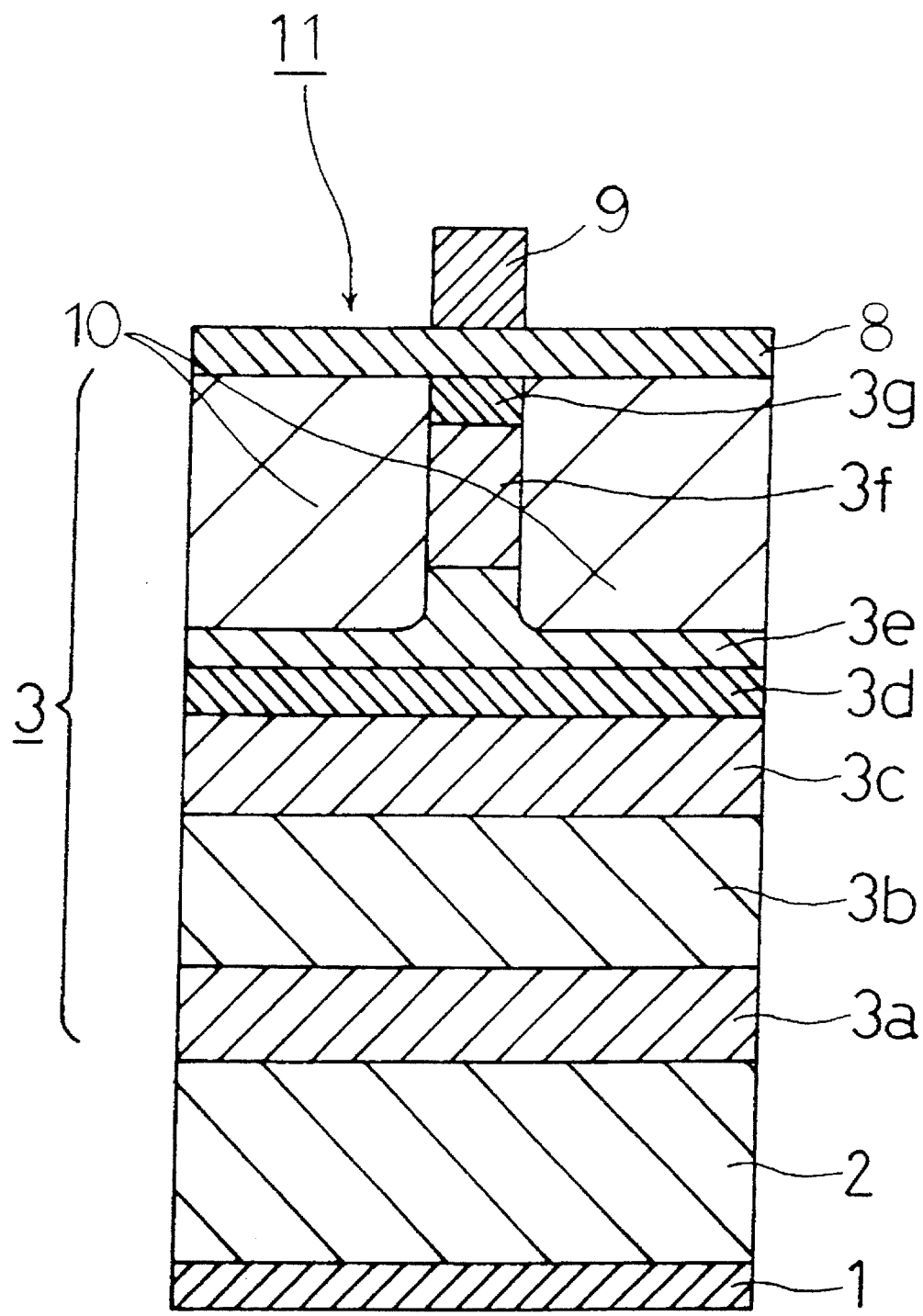
FIG. 3 shows a cross-sectional view of a semiconductor laser of another embodiment of the invention.

A II–VI group semiconductor element as shown in FIG. 3 was manufactured as follows. A ZnSe base SQW-SCH 3 was formed on the surface of a p-type GaAs substrate 2 by an MBE method, and a metal electrode 8 was formed on ZnSe base SQW-SCH 3. A titanium layer and a gold layer were deposited by an electron beam and laminated on ZnSe base SQW-SCH 3, thus forming metal electrode 8 at a thickness of 30 nm. Then, gold electrolytic plating was directed on the laminated layers, thus forming a 10 μm wide and 3 μm thick striped metal section 9 on metal electrode 8. A metal electrode 1 was formed on the bottom surface of the substrate.

Nitrogen ions accelerated at 350 keV acceleration voltage were implanted by irradiation through the top surface of the II–VI group semiconductor element. The incident angle of the ions was 7°, and the dose was $1\times10^{15}$ ions/cm$^2$.

A current blocking layer (insulating layer) 10 with high resistance was formed in the II–VI group semiconductor by implanting ions.

However, ions implanted to metal section 9 lost energy and stopped inside of metal section 9 due to the interaction between the ions and the metal atoms. Thus, the area right below metal section 9 did not achieve resistance.

A 10 μm thick layer of gold was plated on the II–VI group semiconductor element by electrolytic plating. The element was then fixed on a radiator to evaluate the characteristics of the element.

According to the evaluation, semiconductor laser element 11 of the example had lower calorific power and better radiating properties than a conventional semiconductor laser element having SiO$_2$ or polyimide insulating layer. Thus, the life span of semiconductor laser element was from 2 to 7 times longer than that of the conventional semiconductor laser element.

Even though a heat treatment after the implantation of ions is not carried out in the examples of the invention, a heat treatment of 100°–400° C. can be directed to a semiconductor in order to reduce crystal damages as well as the light abosorption of the semiconductor layers.

In this example, the insulating layer was formed in the area above the active layer. However, by increasing the acceleration voltage of implanted ions, the insulating layer can be formed down to the area below the active layer.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A semiconductor element comprising a compound of at least one bivalent element and at least one VI group element, wherein said semiconductor element has an insulating layer, said insulating layer comprising ions implanted on at least one n-type semiconductor layer of the semiconductor element in an amount from $10^{12}$ ions/cm$^2$ to $10^{18}$ ions/cm$^2$, wherein said implanted ions are at least one element selected from the group the consisting of I group and V group.

2. A semiconductor element according to claim 1, wherein the insulating layer has a thickness from 10 nm to 10 µm.

3. A semiconductor element according to claim 1, wherein a compound of at least one bivalent element selected from the group consisting of Zn, Cd, Mg, Mn, Hg and Ca and at least one VI group element selected from the group consisting of S, Se and Te is used for said semiconductor element.

4. A semiconductor element according to claim 1, wherein the semiconductor element is a semiconductor laser element.

5. A semiconductor element according to claim 4, wherein the insulating layer is a current blocking layer.

6. A semiconductor element according to claim 4, wherein the semiconductor element comprises a semiconductor having a multilayer structure on a substrate, a metal electrode formed on one entire surface of said semiconductor and a metal section formed partially on said metal electrode, and wherein said semiconductor except the area right below said metal section is insulated by the implantation of ions, thus forming an insulating layer.

7. A semiconductor element according to claim 6, wherein the metal section, formed partially on the metal electrode, comprises laminated metal layers which form stripes on said metal electrode.

8. A semiconductor element according to claim 6, wherein the metal electrode has a thickness from 10 nm to 1 µm.

9. A semiconductor element according to claim 6, wherein the metal section has a thickness from 0.1 µm to 10 µm.

10. A semiconductor element comprising a compound of at least one bivalent element and at least one VI group element, wherein said semiconductor element has an insulating layer, said insulating layer comprising ions implanted on at least one p-type semiconductor layer of the semiconductor element in an amount from $10^{12}$ ions/cm$^2$ to $10^{18}$ ions/cm$^2$, wherein said implanted ions are at least one element selected from the group consisting of III group and VII group element ions.

* * * * *